Sept. 28, 1965 R. A. GARDENGHI 3,209,166

APPARATUS PROVIDING COMPENSATION FOR THE RATE EFFECT BREAKDOWN IN CONTROLLED RECTIFIERS

Filed Feb. 13, 1962

WITNESSES

Edwin E. Bassler

William L. Gates

INVENTOR

Robert A. Gardenghi

BY Ernest P. Klipfel

ATTORNEY

United States Patent Office 3,209,166
Patented Sept. 28, 1965

3,209,166

APPARATUS PROVIDING COMPENSATION FOR THE RATE EFFECT BREAKDOWN IN CONTROLLED RECTIFIERS

Robert A. Gardenghi, Arbutus, Md., assignor to Westinghouse Electric Corporation, East Pittsburgh, Pa., a corporation of Pennsylvania Filed Feb. 13, 1962, Ser. No. 172,914
6 Claims. (Cl. 307—88.5)

This invention relates to semiconductor circuitry and, more particularly, relates to a neutralization circuit for preventing premature firing of a semiconductor switching device such as the controlled rectifier.

The controlled rectifier is a four-layered, three terminal semiconductor device having an anode, cathode, and gate electrodes. It is analogous to a gas thyratron and is designed to block the flow of current in the forward direction until a small current is applied to the gate terminal, or the forward breakover voltage is exceeded. It is well known that the forward breakover voltage decreases as the rise time of the applied forward signal voltage increases. This effect seriously limits the usefulness of the controlled rectifier in pulse type circuitry where extremely fast rise times are applied to the anode and control of the device is desired only by means of pulsing the gate electrode.

An object of the present invention, therefore, is to provide an improved semiconductor switch circuit.

Another object of the subject invention is to provide means to prevent undesired forward breakover in a semiconductor switch.

Another object of the present invention is to provide a circuit for preventing an undesired premature firing of a four layered three terminal semiconductor switch.

Still another object of the present invention is to provide a feedback circuit for preventing premature breakover of a controlled rectifier.

Other objects and advantages will become apparent after a study of the following specification when read in connection with the accompanying drawings, in which.

Figure 1:
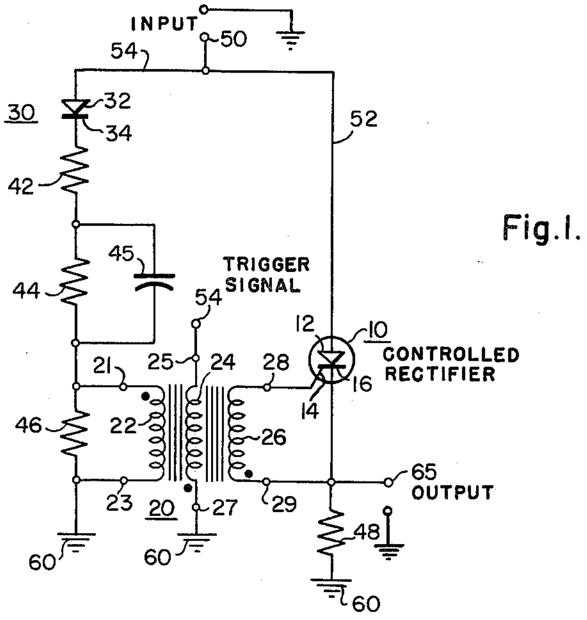
FIGURE 1 is an electrical schematic diagram of apparatus according to the preferred embodiment of the invention.

As hereinbefore stated, a controlled rectifier is designed to block the flow of current in the forward direction until either a small current is applied to the gate terminal or the forward breakover voltage is exceeded. A semiconductor switching device illustrative of a controlled rectifier is described in U.S. Patent No. 2,980,832, issued to E. W. Torok et al. and assigned to the assignee of the present invention. It should be pointed out, however, that such a switching device is mentioned by way of illustration only and is not meant to be interpreted in a limiting sense. Any device having electrical characteristics similar to that shown in FIG. 2 is herein meant to be included.

Since the controlled rectifier is essentially a switch, it can be used to pass or block signals depending on whether or not the gate is triggered. It has been found that if a D.C. reverse bias is applied to the gate terminal of a semiconductor switching device, such as the controlled rectifier, it will be able to block signals having higher values of rise time than is normally possible without such bias. It is when blocking of a relatively fast rise time signal applied to the anode is attempted that the problem of premature firing arises. When a signal having a very fast rise time is applied, some of this signal is effectively coupled to the gate of the switching device by the internal mechanism of the device itself. In some instances, this internally coupled signal can be sufficient to trigger the device to the "on" condition, that is allowing a relatively large current to flow in the forward direction.

The subject invention overcomes the present difficulty of premature firing due to internal coupling of the input signal by taking a small portion of the input waveform and impressing it across a voltage divider formed by resistances 42, 44 and 46; the voltage appearing across resistance 46 is inverted through a transformer 20 and applied to the gate 14 of the semiconductor switch device 10. The voltage thus inverted and applied is a function of the rise time of the input signal due to the action of the capacitor 45 in parallel with resistance 44 which changes its reactance with respect to frequency.

Figure 2:
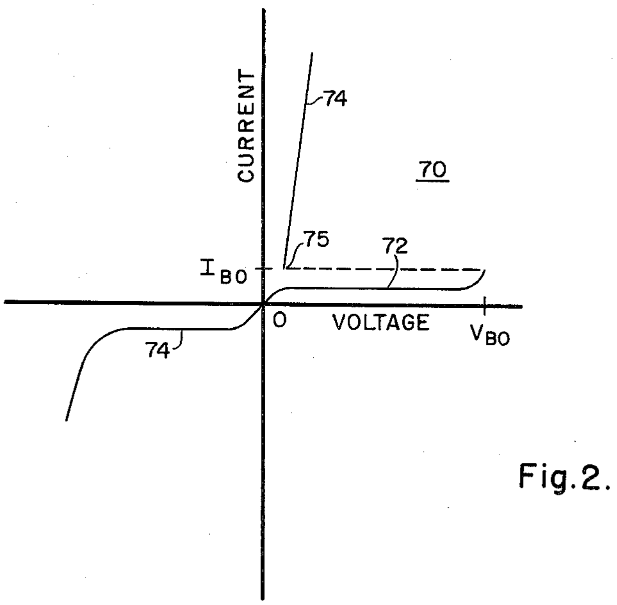
FIG. 2 is a diagram of the electrical characteristics of an illustrative controlled rectifier such as utilized in the preferred embodiment.

Referring more specifically to FIG. 2, the electrical characteristics of a semiconductor switch, such as a controlled rectifier, indicate that with reverse voltage impressed on the device (cathode positive), it blocks the flow of current until the avalanche voltage is reached as in an ordinary rectifier. With positive voltage applied to the anode, the controlled rectifier blocks the flow of current until the forward breakover voltage $V_{BO}$ is reached. At this point, the controlled rectifier switches into a high conduction state 74 and the voltage across the device drops to about 1 volt at point 75. In the high conduction state, the current flow is limited only by the external circuit impedance and supply voltage. At anode-to-cathode voltages less than the breakover voltage, the controlled rectifier can be switched into the high conduction state by a small pulse (typically 1.5 volts and 30 milliamperes) applied to the gate electrode. This method of "turning on" the controlled rectifier by means of a gate permits the control of large amounts of power with low power trigger or gate signal sources. Once the controlled rectifier is in the high conduction state, it continues conduction indefinitely after removal of the gate signal until the anode current is interrupted or diverted by some external means, thus permitting the controlled rectifier to regain its forward blocking capability.

The subject invention provides a means for applying a dynamic reverse bias to the gate only during the rise time of the voltage which the semiconductor switch device is blocking in absence of a trigger or gate input signal to the gate electrode. Referring more specifically to FIGURE 1, an embodiment is shown therein for generating the required dynamic reverse bias. In this embodiment a four layered three terminal semiconductor switch 10, e.g., a controlled rectifier, has an input signal applied to terminal 50 from a signal source, not shown, by means of an input lead 52 to the anode element 12. In order to complete the circuit for the semiconductor switch 10, the cathode element 16 is connected to one end of a load resistance 48; the opposite end of resistance 48 is connected to a point of common reference potential 60 illustrated as ground. The circuit for creating a dynamic reverse bias which neutralizes the internal coupling of a fast rise time input signal to the gate 14 consists in feeding a portion of the input signal from input terminal 50 by means of an input lead 54 to a voltage divider network comprising resistance 42, 44 and 46. This portion of the input signal is applied through semiconductor diode 30 having the anode element 32 attached to the input lead 54 and wherein the cathode element 34 is attached to one side of the first input resistance 42 of the voltage divider network. The opposite end of the first resistance 42 is attached to one end of the second resistance 44. The opposite end of resistance 44 is connected to one end of resistance 46, and the opposite end of resistance 46 is attached to the point of reference potential 60. Connected in parallel with second resistance 42 is a capacitor 45. Transformer means 20 serves to couple both a trigger input voltage and the portion of the input signal appearing across resistance 46 to the gate 14.

The trigger or gate signal is applied to terminal 54 from a driving source, not shown, and terminal 54 is attached to transformer terminal 25. Transformer 25 is connected to one end of the transformer secondary winding 24, the opposite end of winding 24 being connected to terminal 27 and thence to a point of common reference potential 60. The primary winding 22 of transformer 20 is connected across the third resistance 46 such that one end of the transformer is connected to transformer terminal 21 and thence to the common connection between resistance 44 and resistance 46. The opposite end of the primary winding 22 is attached to transformer terminal 23 and thence to a point of common reference potential 60.

The tertiary winding 26 of transformer 20 is connected to the gate electrode 14 through transformer terminal 28. The opposite end of the tertiary winding 26 is connected to terminal 29 which is in turn connected to the common connection of the load resistance 48 and the cathode element 16. The transformer windings 22, 24 and 26 are poled such that the trigger input voltage is applied to the gate element 14 in the same polarity as appears at the trigger input terminal 54. However, it should be noted that the primary winding 22 and the tertiary winding 26 are oppositely poled in order to provide a voltage of opposite polarity to the gate element 14 from that which appears across the third resistance 46.

In operation, the presence of an input voltage at the anode 12 simultaneously with a trigger on the gate 14 will cause current to flow through the semiconductor switch 10 and produce an output signal across the load resistance 48 which in turn appears between the output terminal 65 and the point of reference potential 60.

The voltage divider network including the capacitor 45 utilizes the following typical values:

resistance 42=2.7 K ohms,
resistance 44=22 K ohms,
resistance 46=to 1.2 K ohms, and
capacitor 45=22 $\mu\mu f$.

When a portion of the positive input signal is applied across the voltage divider network through the diode 30, the capacitor 45 serves to adjust the amount of voltage appearing across resistance 46 in proportion to the rise time of the pulse applied. As has been mentioned, the forward breakover voltage of the semiconductor switching device 10 decreases as the rise time of the forward applied voltage is increased. This being the case, a larger reverse bias applied to the gate 14 is required for a fast rise time voltage than is required for a relatively slow one. The capacitor 45 automatically adjusts the required reversed bias applied to the gate by changing the value of the voltage divider with respect to frequency and hence the voltage appearing across resistance 46. In other words, the capacitor 45 is only necessary when the voltage waveform at the anode 12 of semiconductor switch 10 has a very fast rise time. Under steady-state conditions, a reverse bias is neither necessary nor desired.

Considering two extreme cases, first of all when the rise time is very slow, the capacitor 45 is a virtual open circuit and the equivalent circuit appears as the voltage divider 42, 44 and 46 without any shunt capacitance appearing across resistance 44. When the applied voltage has a very fast rise time, the capacitor 45 is a virtual short circuit thus yielding a voltage divider consisting only of resistance 42 and resistance 46. In the first case, the voltage appearing across resistance 46 is very small if not negligible; however, in the second case where the rise time of the applied voltage is very fast the voltage appearing across resistance 46 is appreciable.

It should be pointed out that the gate driving source, not shown, which is applied to terminal 54 must be a relatively high impedance source, that is, it must not be an ideal voltage source where the source impedance approaches a zero value. The reason for this is that a low impedance source would make winding 24 appear as a short circuit and prevent the feedback signal from being coupled from winding 22 to winding 26.

The advantage of the present invention is that the voltage across resistance 46 applies a reverse bias to the gate 14 when and only when it is desired, that is, during the presence of a transient having a very fast rise time.

In summary, the present invention provides an advantageous circuit to prevent premature firing of a semiconductor switching device by means of providing a dynamic reverse bias to neutralize the effect of internal coupling of the input voltage which is capable of triggering the device during the occurrence of a very fast rise time input.

Although the present invention has been described with a certain degree of particularity, it should be pointed out that the present disclosure has been made only by way of example and that numerous changes in the details of circuitry and the combination of arrangement of elements may be resorted to without departing from the scope and the spirit of the invention.

I claim as my invention:

1. A semiconductor circuit comprising in combination: a four-layered, three-terminal semiconductor switch having an anode, a cathode and a gate; input means operably connected to said anode for applying an input signal thereto; circuit means operably connected to said gate for applying a gate signal thereto; means connected to said input means for inductively coupling a portion of said input signal to said gate, said means including means for inverting said portion of said input signal and for applying said inverted portion of said input signal to said gate; and output means connected to said cathode for providing an output signal when said gate signal is applied to said gate.

2. A semiconductor circuit comprising in combination: a controlled rectifier having an anode, a cathode, and a gate electrode; input means operably connected to said anode for applying an input signal of predetermined rise time thereto; means operably connected to said gate for applying a trigger input signal thereto; circuit means connected to said input means for generating a bias voltage in proportion to said rise time of said input signal; means operably connected to said circuit means for inverting and applying said bias voltage to said gate; and output means connected in the anode-cathode path of said rectifier for providing an output signal when said trigger signal is applied to said gate.

3. A semiconductor circuit comprising in combination: a four-layered, three-terminal semiconductor switch having an anode, a cathode, and a gate; input means for applying an input signal to said anode; transformer means operably connected to said gate for applying a trigger signal thereto; circuit means connected to said input means for providing a variable bias voltage for said gate in response to the waveshape of said input signal; transformer means connected to said circuit means for inverting and applying said bias voltage to said gate, providing a dynamic reverse bias to enhance the forward breakover characteristic of said semiconductor switch; and means connected to said cathode to provide an output signal when said trigger input signal is applied to said gate.

4. A semiconductor circuit comprising in combination: a semiconductor switch having an anode, a cathode, and a gate; input means for applying an input signal to said anode; winding means inductively coupled together and responsive to said input signal operably connected to said gate for applying a dynamic reverse bias potential to said gate in response to said input signal, but being of opposite polarity to said input signal for cancelling the effect of the internal coupling of said input signal between said anode and said gate; means for applying a trigger signal to said gate; and circuit means connected to said cathode for providing an output signal when said trigger signal is applied to said gate.

5. A semiconductor circuit comprising in combination: a four-layered, three-terminal semiconductor switch having an anode, a cathode, and a gate; an input means operably connected to said anode; transformer means having a primary winding, a secondary winding and a tertiary winding, said secondary winding being responsive to an input trigger signal and inductively coupled to said tertiary winding, said tertiary winding being operably connected to said gate for coupling said input trigger to said gate, circuit means operably connected to said primary winding for coupling a portion of said input signal to said gate, said primary winding being inductively coupled to and oppositely poled from said tertiary winding for providing a bias to said gate which is of oppisite sense to said input signal; and output means connected to said cathode for providing an output signal when said trigger input signal is applied to said gate.

6. A semiconductor circuit comprising in combination: a four-layered, three-terminal semiconductor switch having an anode, a cathode, and a gate; transformer means having a first, a second and a third winding, a feedback circuit connected to said first winding, said feedback circuit comprises a series combination of a diode, a first, a second and a third resistance, a capacitor connected across said second resistance, said primary winding being connected across said third resistance, said second winding being connected to a source of a trigger input voltage, said third winding being connected to said gate for providing an input trigger voltage to said gate in response to said trigger input voltage and being responsive to said primary winding for providing a bias voltage of opposite sense to said input signal; and means connected to said cathode for providing an output signal when said trigger input is applied to said gate.

References Cited by the Examiner

UNITED STATES PATENTS 2,939,064 5/60 Momberg et al. _____ 307—88.5 X

ARTHUR GAUSS, *Primary Examiner.*